(12) United States Patent
Hsieh et al.

(10) Patent No.: US 9,881,897 B2
(45) Date of Patent: Jan. 30, 2018

(54) MANUFACTURING METHOD OF ULTRA-THIN SEMICONDUCTOR DEVICE PACKAGE ASSEMBLY

(71) Applicants: NIKO SEMICONDUCTOR CO., LTD., New Taipei (TW); SUPER GROUP SEMICONDUCTOR CO., LTD., New Taipei (TW)

(72) Inventors: Chih-Cheng Hsieh, Taoyuan (TW); Hsiu-Wen Hsu, Hsinchu County (TW)

(73) Assignees: NIKO SEMICONDUCTOR CO., LTD., New Taipei (TW); SUPER GROUP SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 14/954,981

(22) Filed: Nov. 30, 2015

(65) Prior Publication Data
US 2016/0211240 A1    Jul. 21, 2016

(30) Foreign Application Priority Data
Jan. 21, 2015    (TW) .............................. 104101993 A

(51) Int. Cl.
*H01L 21/8238* (2006.01)
*H01L 29/423* (2006.01)
(Continued)

(52) U.S. Cl.
CPC .......... *H01L 24/97* (2013.01); *H01L 21/6835* (2013.01); *H01L 21/76898* (2013.01);
(Continued)

(58) Field of Classification Search
CPC . H01L 2224/48091; H01L 2224/48247; H01L 2924/01079; H01L 2924/01078;
(Continued)

(56) References Cited

U.S. PATENT DOCUMENTS

| 2001/0016369 | A1* | 8/2001 | Zandman .......... H01L 21/76898 438/106 |
| 2008/0012119 | A1* | 1/2008 | Otremba ................. H01L 21/78 257/698 |

(Continued)

*Primary Examiner* — Allen Parker
*Assistant Examiner* — Long H Le
(74) *Attorney, Agent, or Firm* — Li & Cai Intellectual Property (USA) Office

(57) ABSTRACT

A manufacturing method of ultra-thin semiconductor device package structure is provided. Firstly, a wafer including a plurality of semiconductor devices is provided, and one of the semiconductor devices has an active surface having an active region and an outer region and a back surface. A first electrode and a second electrode are arranged in the active region, and the outer region has a cutting portion and a channel portion. Subsequently, a trench is formed in the channel portion, and filled with a conductive structure. The wafer is fixed on a supporting board, and then a thinning process and a deposition process of a back electrode layer are performed on the back surface in sequence. Thereafter, the supporting board is removed and a plurality of contacting pads is formed. A cutting process is performed along the cutting portion.

11 Claims, 10 Drawing Sheets

(51) Int. Cl.
*H01L 27/092* (2006.01)
*H01L 23/00* (2006.01)
*H01L 21/683* (2006.01)
*H01L 21/78* (2006.01)
*H01L 29/66* (2006.01)
*H01L 21/768* (2006.01)
*H01L 23/495* (2006.01)

(52) U.S. Cl.
CPC .............. *H01L 21/78* (2013.01); *H01L 24/05* (2013.01); *H01L 24/94* (2013.01); *H01L 29/66666* (2013.01); *H01L 23/495* (2013.01); *H01L 24/03* (2013.01); *H01L 24/06* (2013.01); *H01L 24/11* (2013.01); *H01L 24/29* (2013.01); *H01L 24/32* (2013.01); *H01L 24/73* (2013.01); *H01L 24/83* (2013.01); *H01L 2221/6834* (2013.01); *H01L 2221/68327* (2013.01); *H01L 2224/02372* (2013.01); *H01L 2224/0345* (2013.01); *H01L 2224/0347* (2013.01); *H01L 2224/0391* (2013.01); *H01L 2224/03452* (2013.01); *H01L 2224/03462* (2013.01); *H01L 2224/0401* (2013.01); *H01L 2224/04026* (2013.01); *H01L 2224/05548* (2013.01); *H01L 2224/05568* (2013.01); *H01L 2224/05582* (2013.01); *H01L 2224/05583* (2013.01); *H01L 2224/05639* (2013.01); *H01L 2224/05647* (2013.01); *H01L 2224/05655* (2013.01); *H01L 2224/06181* (2013.01); *H01L 2224/1132* (2013.01); *H01L 2224/11462* (2013.01); *H01L 2224/16227* (2013.01); *H01L 2224/29111* (2013.01); *H01L 2224/32245* (2013.01); *H01L 2224/83192* (2013.01); *H01L 2224/83862* (2013.01); *H01L 2224/92242* (2013.01); *H01L 2224/94* (2013.01); *H01L 2224/97* (2013.01)

(58) Field of Classification Search
CPC ........... H01L 21/6835; H01L 21/76898; H01L 21/78; H01L 24/05; H01L 24/94; H01L 29/66666
See application file for complete search history.

(56) References Cited

U.S. PATENT DOCUMENTS

| | | | | |
|---|---|---|---|---|
| 2009/0152715 | A1* | 6/2009 | Shim | H01L 21/568 257/737 |
| 2009/0261468 | A1* | 10/2009 | Kroeninger | H01L 21/568 257/690 |
| 2010/0252935 | A1* | 10/2010 | Lee | H01L 21/76898 257/774 |
| 2010/0311208 | A1* | 12/2010 | Sirinorakul | H01L 21/4832 438/113 |
| 2012/0273926 | A1* | 11/2012 | Pagaila | H01L 23/552 257/659 |
| 2013/0154108 | A1* | 6/2013 | Lin | H01L 23/5389 257/774 |

* cited by examiner

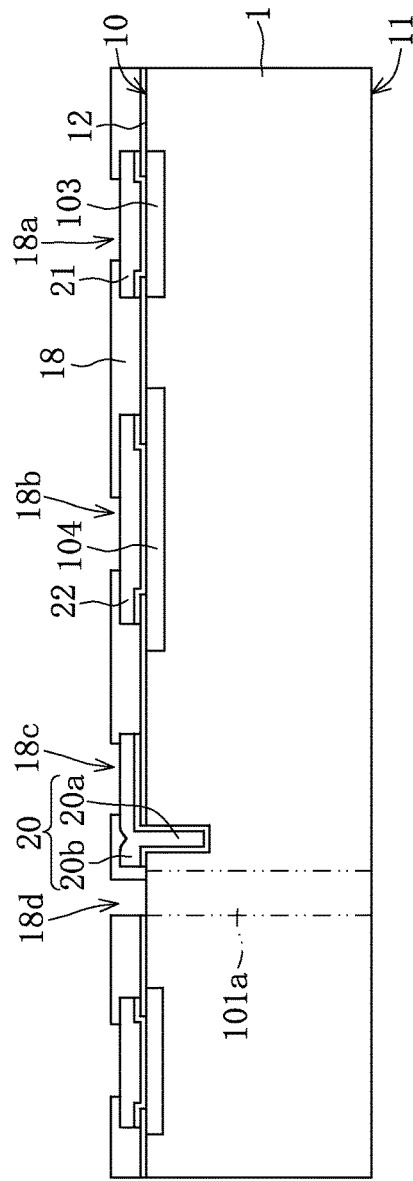
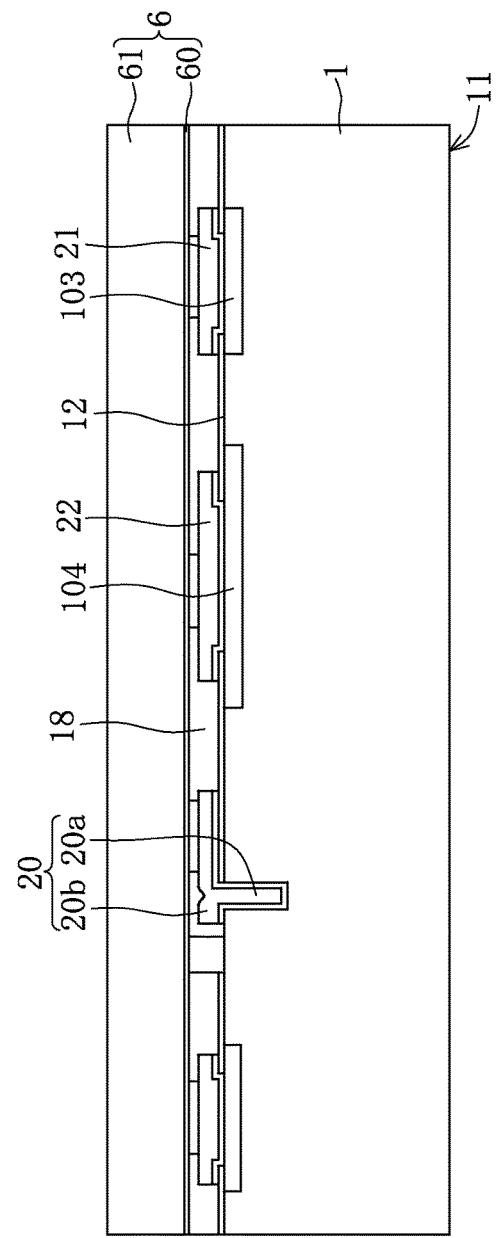

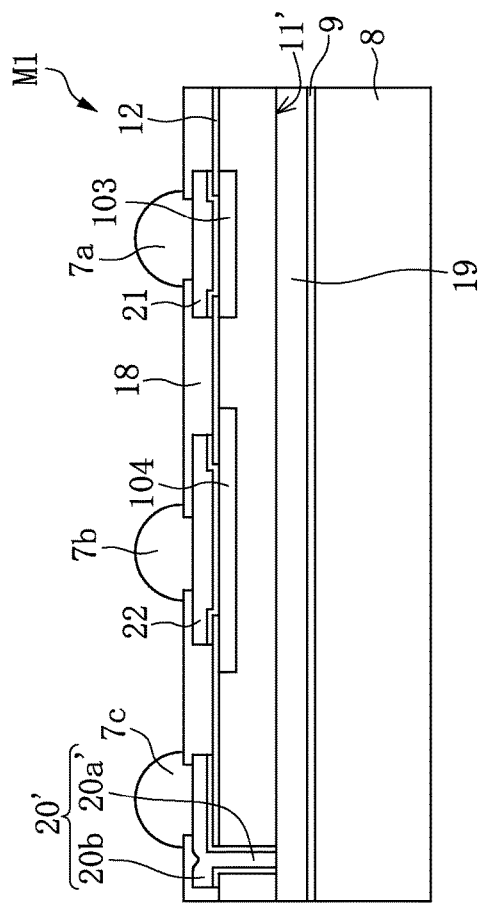
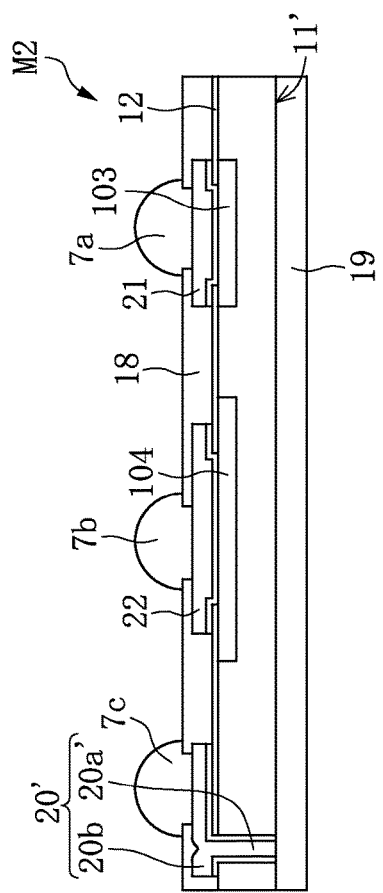
FIG.3A
FIG.3B

MANUFACTURING METHOD OF ULTRA-THIN SEMICONDUCTOR DEVICE PACKAGE ASSEMBLY

BACKGROUND OF THE INVENTION

1. Field of the Invention

The instant disclosure relates to a semiconductor package process, in particular, to a manufacturing method of ultra-thin semiconductor device package assembly.

2. Description of Related Art

As the demand for power efficiency has become increasingly severe, chip structure design must be modified to improve the power efficiency. In addition, thinning the base of the chip also can result in shorter current path and lower resistance so as to achieve higher power efficiency. Under the conditions that the mechanical structure and the breakdown voltage of the vertical power device are not affected, thinning the wafer is an effective solution for reducing the resistance of the vertical power devices. However, the thinner the wafer, the more easily the warpage of the wafer occurs. The warpage may easily result in cracks in the wafer during the transportation or the fabricating process.

SUMMARY OF THE INVENTION

The object of the instant disclosure is to provide a manufacturing method of an ultra-thin semiconductor device package structure. The method comprises the following steps. Firstly, a wafer having a plurality of semiconductor devices is provided. One of the semiconductor devices, a first semiconductor device, has an active surface and a back surface. The active surface includes an active region and an outer region. A first electrode and a second electrode are arranged in the active region, and the outer region is divided into a cutting portion and a channel portion. Subsequently, a patterned protecting layer having a plurality of openings is formed on the active surface to respectively expose the first electrode, the second electrode, and the outer region. Next, a trench is formed in the channel portion, in which the trench has a first depth less than a thickness of the wafer. Thereafter, a conductive structure is formed in the trench. In addition, a supporting board is provided, and the wafer is disposed on the supporting board with the active surface facing to the supporting board. Subsequently, a thinning process is performed upon the first semiconductor device from the back surface to expose the conductive structure, and then a back electrode layer is formed on the back surface of the first semiconductor device. The supporting board is separated from the wafer, and a plurality of contacting pads is formed on the active surface to respectively electrically connect the first electrode, the second electrodes and the conductive structure. Subsequently, a cutting process is performed on the cutting portion.

In order to further the understanding regarding the instant disclosure, the following embodiments are provided along with illustrations to facilitate the disclosure of the instant disclosure.

BRIEF DESCRIPTION OF THE DRAWINGS

FIG. 2G shows a sectional view of the ultra-thin semiconductor device package structure in a step of the manufacturing method in FIG. 1 in accordance with one embodiment of the instant disclosure;

FIG. 2H shows a sectional view of the ultra-thin semiconductor device package structure in a step of the manufacturing method in FIG. 1 in accordance with one embodiment of the instant disclosure;

FIG. 3A shows a sectional view of the ultra-thin semiconductor device in accordance with one embodiment of the instant disclosure;

FIG. 3B shows a sectional view of the ultra-thin semiconductor device in accordance with another embodiment of the instant disclosure.

DETAILED DESCRIPTION OF THE PREFERRED EMBODIMENTS

Figure 1:
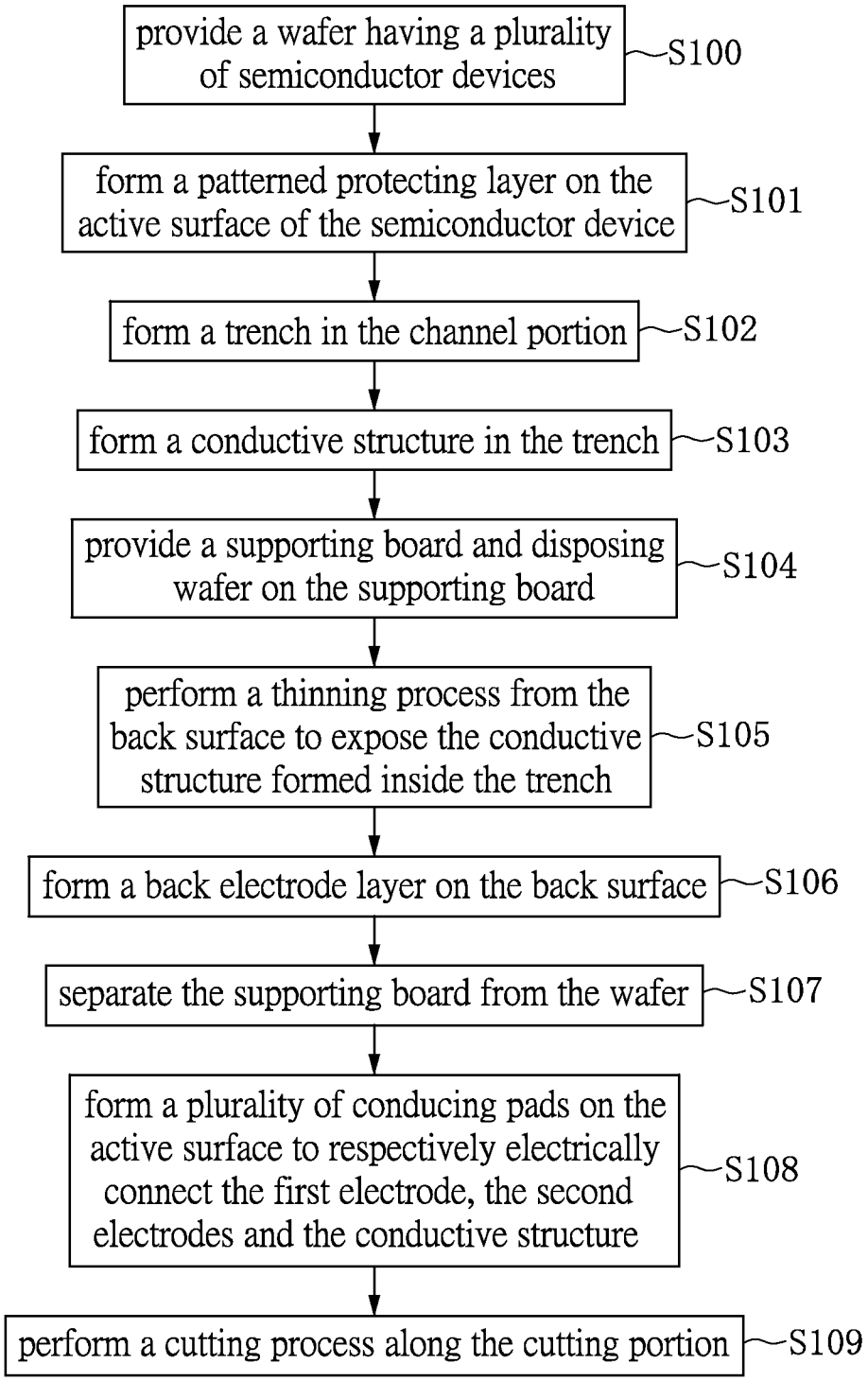
FIG. 1 shows a flow chart of the manufacturing method of ultra-thin semiconductor device package structure in accordance with an embodiment of the instant disclosure.

Please refer to FIG. 1. FIG. 1 shows a flow chart of the manufacturing method of an ultra-thin semiconductor device package structure in accordance with an embodiment of the instant disclosure. Please refer to FIGS. 2A to 2M, which respectively show sectional views of the ultra-thin semiconductor device package structure in different steps of the manufacturing method in FIG. 1 in accordance with one embodiment of the instant disclosure.

In step S100, a wafer having a plurality of semiconductor devices is provided. The wafer is usually made of Si or other semiconductor materials, such as GaAs. In the embodiment of the instant disclosure, the wafer 100 has a thickness of 250 to 700 μm. In the embodiment of the instant disclosure, the processes of fabricating the devices on the wafer 100 have been completed, and the wafer 100 includes a plurality of semiconductor devices.

In an embodiment, a package structure, which is fabricated by the manufacturing method of an ultra-thin semiconductor device package structure provided in the instant disclosure, has only one semiconductor device. For example, only one first semiconductor device 1 is included in the package structure. In another embodiment, two or more semiconductor devices may be packaged in common package structure. As such, the number of the semiconductor devices packaged in one package structure is not limited. Additionally, in the instant embodiment, the first semiconductor device 1 is a vertical power device, such as a vertical metal-oxide-semiconductor field effect transistor (MOSFET).

Figure 2A:
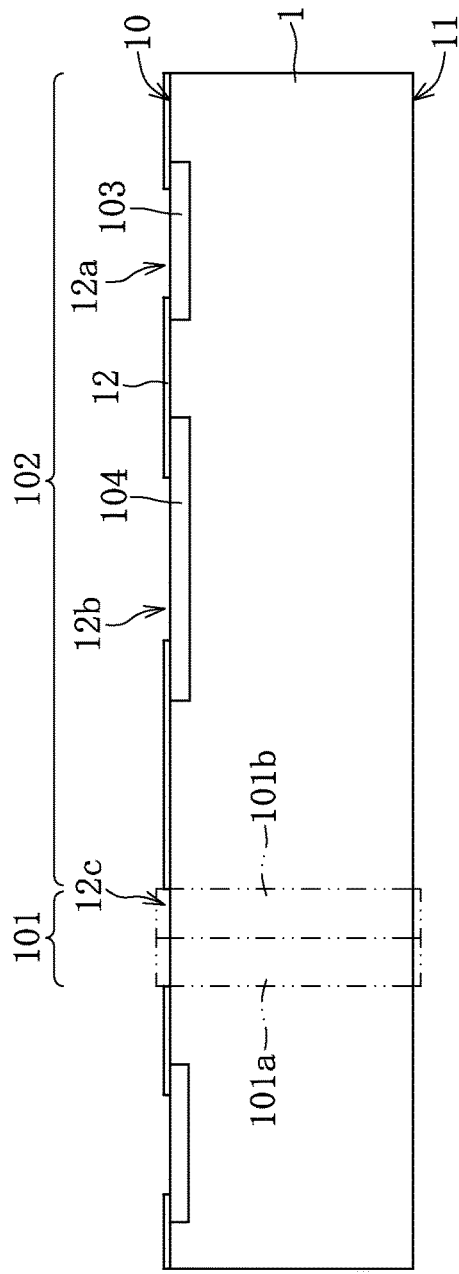
FIG. 2A shows a sectional view of an ultra-thin semiconductor device package structure in a step of the manufacturing method in FIG. 1 in accordance with one embodiment of the instant disclosure.
Figure 2B:
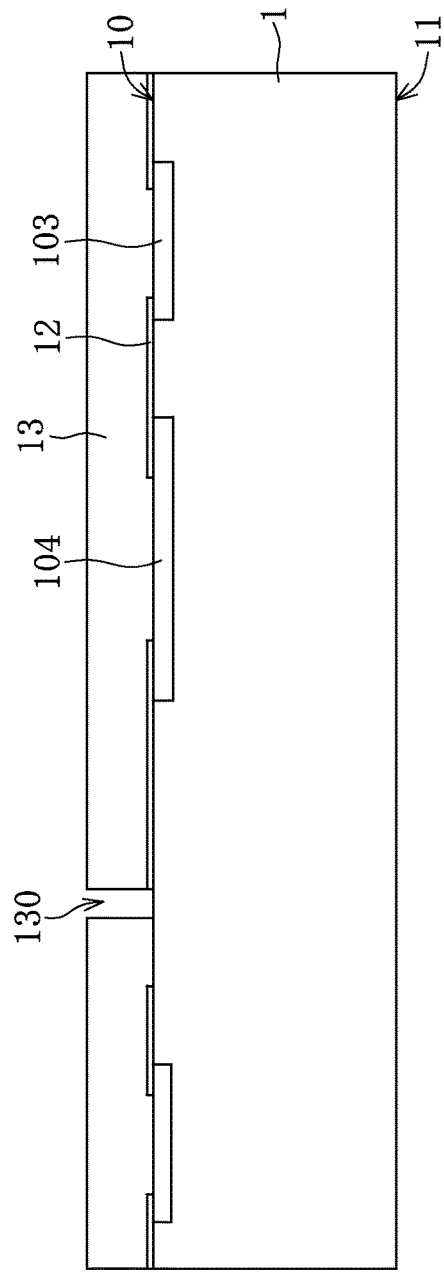
FIG. 2B shows a sectional view of the ultra-thin semiconductor device package structure in a step of the manufacturing method in FIG. 1 in accordance with one embodiment of the instant disclosure.

Please refer to FIG. 2A. FIG. 2A illustrates a sectional view of localized wafer, i.e., a sectional view of the first semiconductor. The first semiconductor device 1 has an active surface 10 and a back surface 11 opposite thereto, in which the back surface 11 is a portion of the back of the wafer.

The active surface 10 of the first semiconductor device 1 has an outer region 101 and an active region 102 defined thereon, in which the outer region 101 surrounds the active region 102, i.e., the outer region 101 is formed on a peripheral region of the first semiconductor device 1. The active region 102 is defined in a central region of the first semiconductor device 1. A first electrode 103 and a second electrode 104 are arranged in the active region 102. In an embodiment of the instant disclosure, the first electrode 103 can serve as gate electrode, and the second electrodes 104 can serve as source electrodes.

The outer region 101 of the first semiconductor device 1 can be divided into a cutting portion 101a and a channel portion 101b. In the instant embodiment, each of semiconductor devices can correspond to one channel portion, or a plurality of the semiconductor devices correspond to one channel portion. Thus, the configuration and the correspondence between the semiconductor devices and the channel portion are not intended to be limited by the instant disclosure.

Subsequently, in step S101, a patterned protecting layer is formed on the active surface. As shown in FIG. 2A, the patterned protecting layer 12 has been formed on the active surface 10 of the first semiconductor device 1. The patterned protecting layer 12 can be a dielectric layer for protecting the active region 102 of the first semiconductor device 1 from being contaminated, which may impact the device characteristics.

The patterned protecting layer 12 has a plurality of openings 12a-12c. In the instant embodiment, the openings 12a-12c respectively expose the first electrode 103, the second electrode 104 and the outer region 101 of the first semiconductor device 1. The patterned protecting layer 12 can be made of phosphosilicate glass, polyimide, silicon nitride, or silicon oxide ($SiO_4$). In the instant embodiment, the patterned protecting layer 12 has a thickness ranging from 0.5 μm to 5 μm.

Specifically, in an embodiment of the instant disclosure, a margin area of the first electrode 103 and a margin area of the second electrode 104 of the first semiconductor device 1 are covered by the patterned protecting layer 12, but a central area of the first electrode 103 and a central area of the second electrode 104 are exposed respectively through the openings 12a and 12b. In addition, in the instant embodiment, the opening 12c of the patterned protecting layer 12 exposes the outer region 101. In another embodiment, on the condition that anther protecting layer has been formed on the active surface 10, the step S101 can be omitted.

Figure 2C:
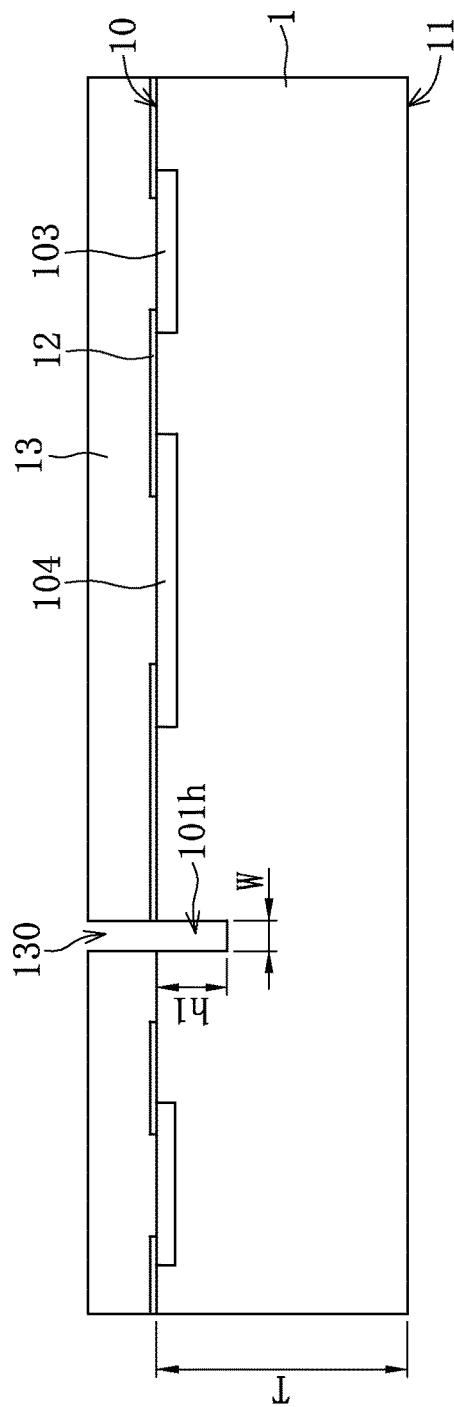
FIG. 2C shows a sectional view of the ultra-thin semiconductor device package structure in a step of the manufacturing method in FIG. 1 in accordance with one embodiment of the instant disclosure.

Please refer to FIG. 1. In step S102, a trench is formed in the channel portion. Please refer to FIGS. 2B and 2C, which illustrate the sectional views of the ultra-thin semiconductor device package structure in step S102 of the manufacturing method in accordance with one embodiment of the instant disclosure. In the instant embodiment, the step of forming the trench 101h is carried out by exposure, development, and etching processes. Specifically, a first photoresist layer 13 is formed on the active surface 10 of the first semiconductor device 1. The first photoresist layer 13 is exposed and developed such that a pattern 130 predefines the position of the trench 101h formed in the first photoresist layer 13. Subsequently, as shown in FIG. 2C, an etching process, such as a wet or dry etching process, is performed on the first semiconductor device 1 to form the trench 101h, which is located at the channel portion 101b. In another embodiment, the trench 101h also can be formed by laser cutting or mechanical scribing.

In the instant embodiment, the trench 101 has a first depth h1 less than a thickness T of the wafer. In other words, the trench 101 can be a blind hole. When the trench 101h is formed by wet etching process, the etching rate can be controlled through adjusting the etching solutions, the concentration of the etching solution and the temperature so as to adjust the first depth h1 of the trench 101h. In the embodiment, the first depth h1 of the trench 101h is determined according to a thickness of the thinned wafer. In one preferred embodiment, the first depth h1 of the trench 101h is larger than a thickness of the thinned wafer. For example, if assuming that the thinned wafer has the thickness of 50 μm, the first depth h1 would be greater than 50 μm, preferably, at least 60 μm.

Notably, the trench 101h will be filled with a conductive structure to electrically connect the drain of the first semiconductor device 1. If a width W of the trench 101h was too narrow, it would be unfavorable for the semiconductor device to output large current. If the width W of the trench 101h is too broad, the area of the cutting portion 101a would be limited such that it is difficult for a cutting tool to align with the cutting portion 101a during the step of performing the following cutting process. Accordingly, in the embodiment, the trench 101h has the width W ranging from 5 μm to 50 μm. After the step of forming the trench 101h, the first photoresist layer 13 is removed.

Figure 2D:
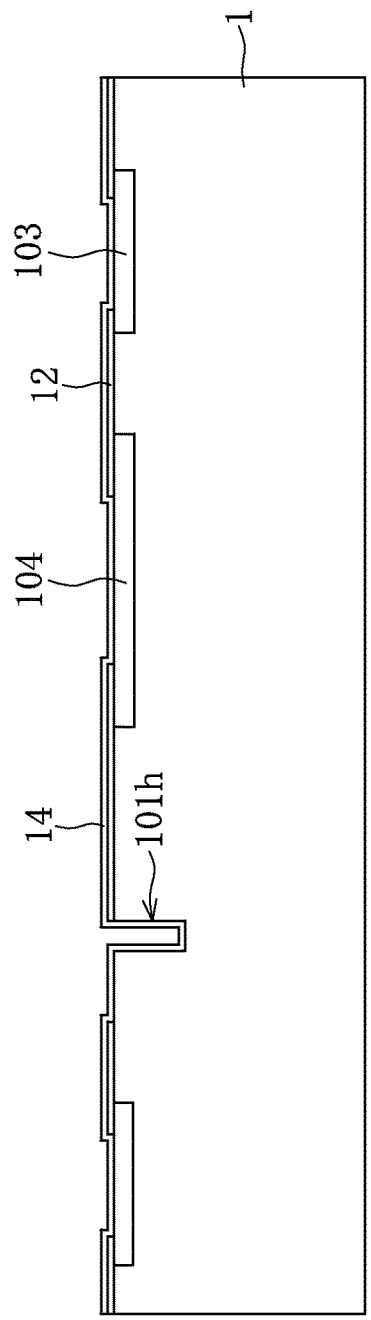
FIG. 2D shows a sectional view of the ultra-thin semiconductor device package structure in a step of the manufacturing method in FIG. 1 in accordance with one embodiment of the instant disclosure.

Please refer to FIG. 1. In step S103, a conductive structure is formed in the trench. Please refer to FIGS. 2D to 2F, which respectively show the sectional views of the ultra-thin semiconductor device package structure in step S103 in accordance with an embodiment of the instant disclosure. As shown in FIG. 2D, at least one metal barrier layer 14 is formed on the active surface 10. The metal barrier layer 14 conformingly covers the inner walls of the trench 101h, the patterned protecting layer 12, the first electrode 103, and the second electrode 104. In the instant embodiment, the metal barrier layer 14 can be formed by sputtering deposition, and the metal barrier layer 14 can be made of the material selected from the group consisting of titanium, copper, tungsten and the combination thereof. In addition, the metal barrier layer 14 has a thickness ranging from 0.2 µm to 10 µm.

Figure 2E:
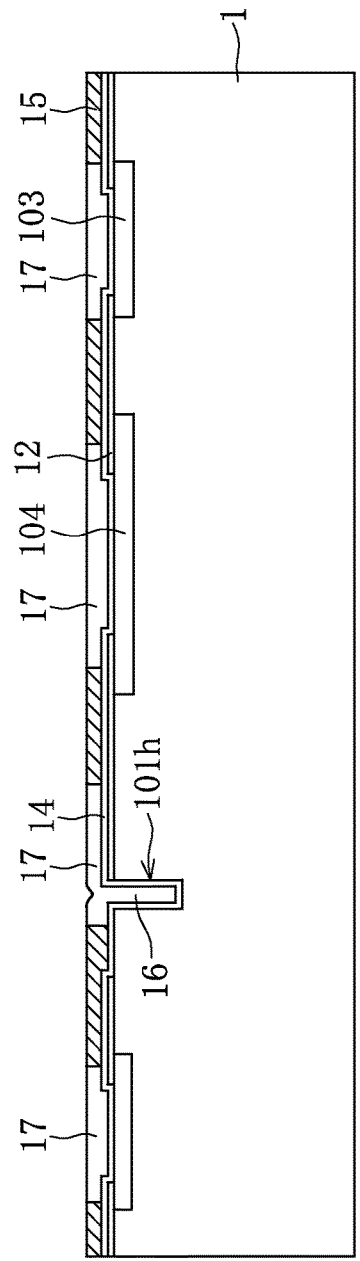
FIG. 2E shows a sectional view of the ultra-thin semiconductor device package structure in a step of the manufacturing method in FIG. 1 in accordance with one embodiment of the instant disclosure.

Please refer to FIG. 2E. Subsequently, a second photoresist layer 15 having a plurality of opening patterns (not labeled in FIG. 2E) is formed on the metal barrier layer 14. The opening patterns respectively correspond to the positions of the first electrode 103, the second electrode 104 and the trench 101h so as to respectively define the locations and the shapes of the contact pads which will be formed in the following steps.

In one embodiment, the cutting portion 101a of the outer region 101 is completely covered by the second photoresist layer 15. In addition, the aperture size of one of the opening patterns corresponding to the trench 101h is greater than the width W of the trench 101h to expose the trench 101h, and portions of the metal barrier layer 14 formed on the channel portion 101b and formed on the active region 102. Notably, the shape and the position of each of the contact pads is defined by the opening patterns of the second photoresist layer 15. The contact pads may be used to electrically connect the first semiconductor device 1 and the components mounted on the printed circuit board in the following processes.

Please refer to FIG. 2E. As shown in FIG. 2E, a metal conductive structure 16 is formed in the trench 101h, and the opening patterns of the second photoresist layer 15 are respectively filled with a plurality of metal conductive layers 17. Specifically, the trench 101h is filled with the metal conductive structure 16, and then the metal conductive layers 17 are respectively formed in the positions respectively defined by the opening patterns. In the instant embodiment, the metal conductive structure 16 and the metal conductive layers 17 are formed by an electroplating process, and made of copper, nickel, or another alloy. In an embodiment, each of the metal conductive layers 17 has a thickness ranging from 5 µm to 30 µm.

Figure 2F:
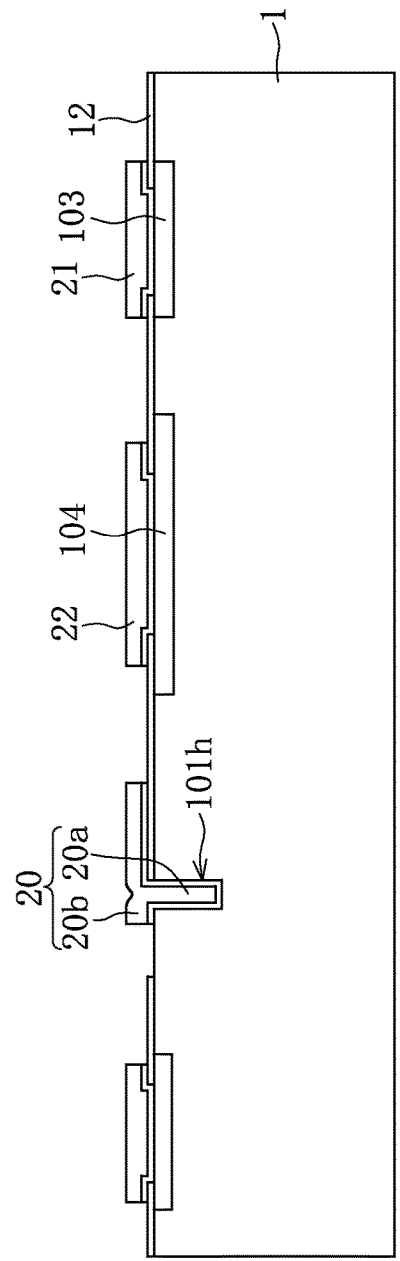
FIG. 2F shows a sectional view of the ultra-thin semiconductor device package structure in a step of the manufacturing method in FIG. 1 in accordance with one embodiment of the instant disclosure.

Subsequently, please refer to FIG. 2F. The second photoresist layer 15 and a portion of the metal barrier layer 14 covered by the second photoresist layer 15 are removed. Thereafter, a first pad 21, a second pad 22, and the conductive structure 20 which are insulated from each other are formed. The conductive structure 20 includes a connecting portion 20a and a pad 20b. Specifically, one portion of the metal barrier layer 14 formed inside the trench 101h and the metal conductive structure 16 are integrated to the connecting portion 20a. Another portion of the metal barrier layer 14 formed on the active surface 10 adjacent to the trench 101h and one of the metal conductive layers 17 formed on the metal conductive structure 16 are integrated to the pad 20b.

Subsequently, please refer to FIG. 2G. A dielectric layer 18 is formed on the active surface 10, in which the dielectric layer 18 has a plurality of aperture regions 18a-18d to respectively expose a portion of the first pad 21, a portion of the second pad 22, a portion of the pad 20b, and the cutting portion 101a. In addition, the aperture regions 18a-18c respectively define the positions of the electrical contacts respectively formed on the first pad 21, the second pad 22, and the pad 20b in the following processes.

In addition, the dielectric layer 18 can be used to assist in protecting the active surface 10, and the dielectric layer 18 can be made of polyimide (PI) or benzocyclobutene (BCB). In an example, the dielectric layer 18 has a thickness ranging from 5 µm to 20 µm. The step of forming the dielectric layer 18 is an optional step. That is, in another embodiment, the step of forming the dielectric layer 18 can be omitted.

Please refer to FIG. 1. In step S104, a supporting board is provided, and the wafer is disposed on the supporting board with the active surface facing to the supporting board. Please refer to FIG. 2H, which illustrates a sectional view of the ultra-thin semiconductor device package structure in step S104 in accordance with an embodiment of the instant disclosure.

As illustrated in FIG. 2H, when the wafer is disposed on the supporting board 6, the active surface 10 of the first semiconductor device 1 faces to the supporting board 6. In addition, in an embodiment of the instant disclosure, the supporting board 6 includes a plate body 61 and an adhesive layer 60. When the wafer is disposed on the supporting board 6, the adhesive layer 60 is connected between the active surface 10 and the plate body 61. That is, the wafer is connected to the plate body 61 through the adhesive layer 60. However, the adhesive layer 60 is adhered to the metal conductive layer 17 and the dielectric layer 18 with a weak adhesion force, so that the supporting board 6 can be easily separated from the wafer (or the first semiconductor device 1) by hand or machine The adhesive layer 60 can be a double-sided tape or other releasable adhesives, such as UV-curing adhesive, thermo-curing adhesive or metal adhesive tape. In another embodiment, the adhesive layer 60 can be a reusable pressure sensitive adhesive, such as rubber-based pressure sensitive adhesive, acrylic-based pressure sensitive adhesive or silicone resin-based pressure sensitive adhesive.

Please refer to FIG. 1. Subsequently, in step S105, a thinning process is performed upon the first semiconductor device from the back surface to expose the conductive structure formed inside the trench. Please refer to FIG. 2I, which illustrates a sectional view of the ultra-thin semiconductor device package structure in step S105. In one embodiment, the thinning process can be a back-grinding process, i.e., the thinning process is performed upon the first semiconductor device 1 from the back surface 11 by using a grinding machine until the connecting portion 20a' of the conductive structure 20' formed inside the trench 101h is exposed on the grinded back surface of the first semiconductor device 1. That is, after the thinning process is performed, the trench 101h extends from the active surface 10 to the grinded back surface 11' of the first semiconductor device 1, and has a second depth h2. The second depth h2 is equal to a thickness of the thinned first semiconductor device 1, and less than the first depth h1.

Figure 2I:
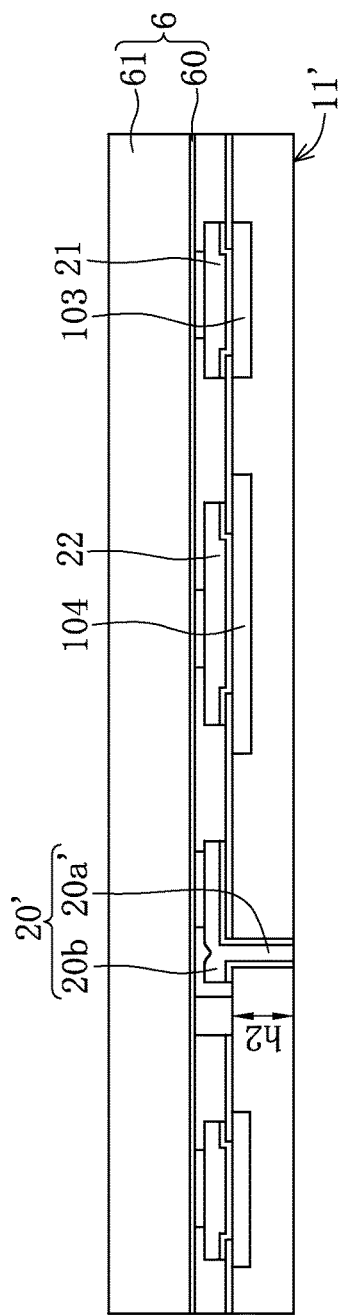
FIG. 2I shows a sectional view of the ultra-thin semiconductor device package structure in a step of the manufacturing method in FIG. 1 in accordance with one embodiment of the instant disclosure.

It is worth noting that FIG. 2I only illustrates the step of performing a thinning process upon the first semiconductor device 1 from the back surface 11, but one of ordinary skill in the art should understand that, in reality, the thinning process is performed by grinding the entire wafer from the backside thereof so that the wafer is thinned to have a predetermined thickness. In an embodiment, a thickness of the first semiconductor device 1, i.e., the predetermined thickness of the thinned wafer ranges from 50 µm to 60 µm.

Figure 2J:
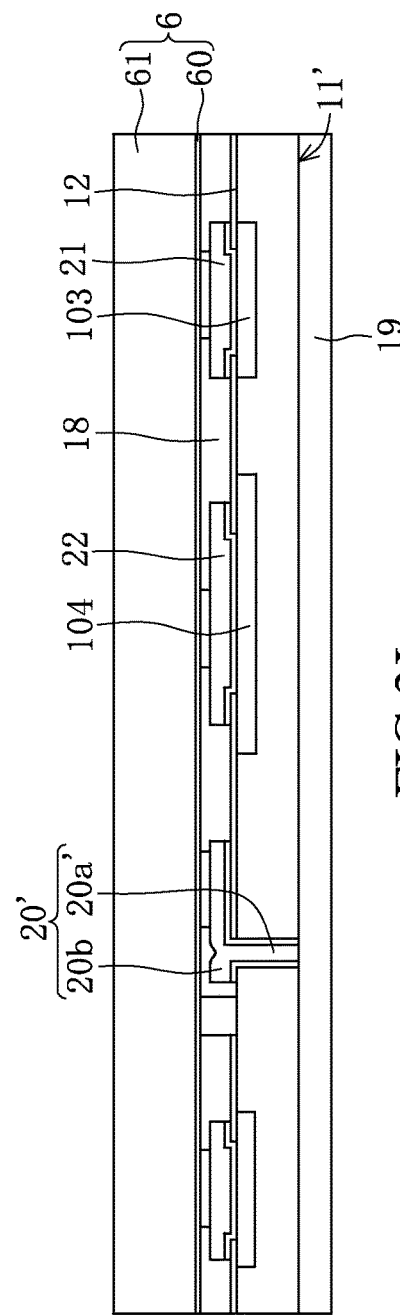
FIG. 2J shows a sectional view of the ultra-thin semiconductor device package structure in a step of the manufacturing method in FIG. 1 in accordance with one embodiment of the instant disclosure.

Please refer to FIG. 1. In step S106, a back electrode layer is formed on the back surfaces. Specifically, please refer to FIG. 2J, which shows a sectional view of the ultra-thin semiconductor device package structure in step S106 in accordance with one embodiment of the instant disclosure. As shown in FIG. 2J, the back electrode layer 19 is formed on the grinded back surface 11' of the first semiconductor device 1. In addition, the back electrode layer 19 can be formed by, but is not limit to, chemical vapor deposition (CVD) or physical vapor deposition (PVD), such as evaporation or sputtering deposition.

Furthermore, the back electrode layer 19 can be made of a conductive material layer to serve as a drain electrode of the first semiconductor device 1. In one embodiment, the back electrode layer 19 is a metal-stacked layer, such as a Ti/Cu stacked layer, and has a thickness ranging from a few micrometers to hundreds of micrometers. In another embodiment, the back electrode layer 19 can be a Ti/Ni/Ag stacked layer, in which the titanium layer has a thickness of 200 nm, the nickel layer has a thickness of 300 nm, and the silver layer has a thickness of 2000 nm. However, the back electrode layer 19 also can be made of another material, and thus the aforementioned materials and the structure of the back electrode layer 19 are not intended to limit the instant disclosure.

Although FIG. 2J shows the back electrode layer 19 is formed on the grinded back surfaces 11' of the first semiconductor device 1, one of ordinary skill in the art should know, in reality, the back electrode layer 19 is formed on the entire wafer back.

Figure 2K:
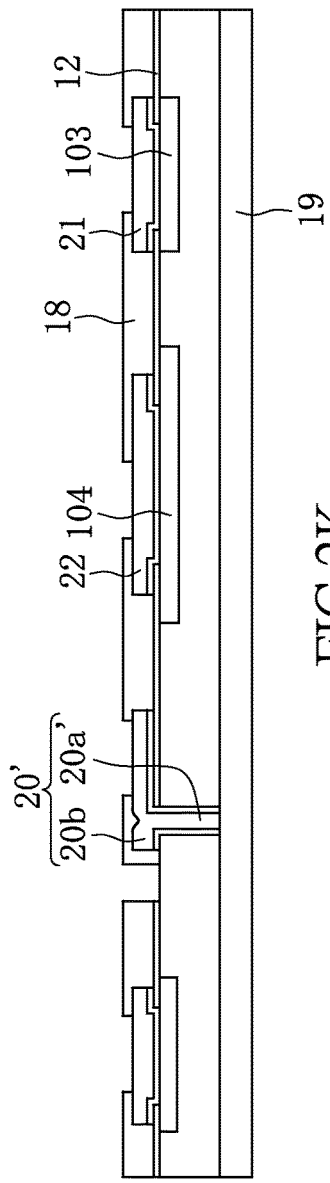
FIG. 2K shows a sectional view of the ultra-thin semiconductor device package structure in a step of the manufacturing method in FIG. 1 in accordance with one embodiment of the instant disclosure.
Figure 2L:
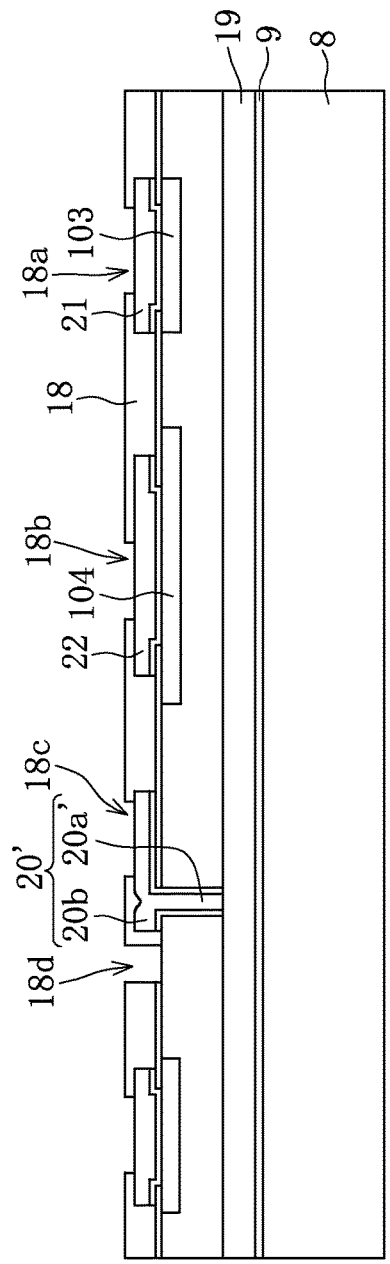
FIG. 2L shows a sectional view of the ultra-thin semiconductor device package structure in a step of the manufacturing method in FIG. 1 in accordance with one embodiment of the instant disclosure.

Subsequently, please refer to FIG. 1 and FIG. 2K, in which FIG. 2K shows a sectional view of the ultra-thin semiconductor device package structure in step S107 of the manufacturing method in FIG. 1 in accordance with one embodiment of the instant disclosure. In step S107, the supporting board is separated from the wafer. Notably, because the back electrode layer 19 having a certain thickness has been formed before the supporting board 6 is removed, the back electrode layer 19 can provide the thinned wafer with a supporting force even if the supporting board 6 is removed and can attenuate the occurrence of wafer warpage due to a too thin wafer. As such, the probability of breaks or cracks on the wafer during the following processes or transportation can be decreased.

When the supporting board 6 is separated from the wafer, because the connecting force between the adhesive layer 60 and the first semiconductor device 1 is less than that between the adhesive layer 60 and the plate body 61, the supporting board 6 and the first semiconductor device 1 can be separated from each other without applying too much external force. After the supporting board 6 is separated from the first semiconductor device 1, a cleaning step can be carried out to avoid residue of the adhesive layer 60 on the first pad 21, the second pad 22 or the pad 20b, which may result in poor electrical performance of the first semiconductor device 1. In another embodiment, the supporting board 6 can include only the plate body 61, and the plate body 61 can be fixed on the wafer by another means.

In an embodiment of the instant disclosure, after the supporting board 6 is separated from the wafer, a metal sheet can be provided and adhered to the back electrode layer 19 by using a conducting paste to enhance a heat dissipation efficiency and mechanical strength. As such, it is not necessary to form a thicker back electrode layer 19 so that the cost can be saved. Please refer to FIG. 2L, which shows a sectional view of the ultra-thin semiconductor device package structure after a step of separating the supporting board from the wafer in accordance with another embodiment of the instant disclosure.

The manufacturing method of an ultra-thin semiconductor device package structure can further include a step of attaching a metal plate 8 to the back electrode layer 19 with a conducting adhesive 9. In this case, the metal plate 8 has a thickness greater than the thickness of the back electrode layer 19. In addition, the metal plate 8 also can be electrically connected to the drain of the first semiconductor device 1. Accordingly, compared with an embodiment in which the first semiconductor device 1 is without the metal plate 8, the back electrode layer 19 of the instant embodiment can be formed with thinner thickness. For example, the back electrode layer 19 has the thickness ranging from 2 μm to 3 μm, and the metal plate 8 can have a thickness ranging from 200 μm to 300 μm. In addition, the metal plate 8 can have substantially the same shape as that of the wafer.

However, in another embodiment, another means for enhancing the heat dissipation efficiency and mechanical strength of the semiconductor device package structure also can be used. As such, the step of attaching the metal plate 8 to the back electrode layer 19 is an optional step.

Figure 2M:
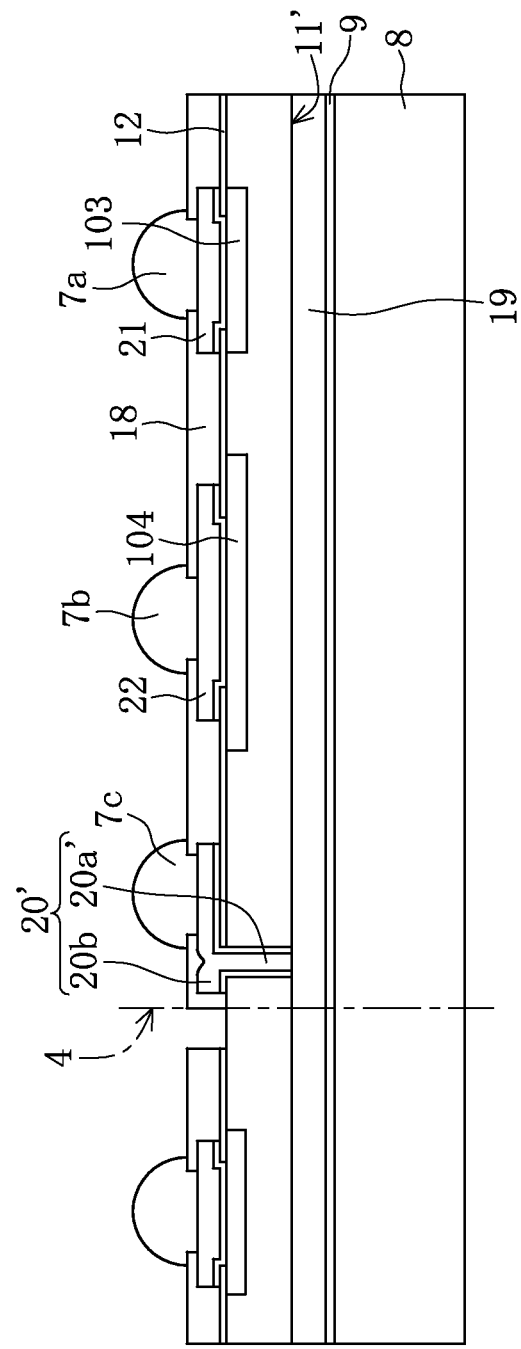
FIG. 2M shows a sectional view of the ultra-thin semiconductor device package structure in a step of the manufacturing method in FIG. 1 in accordance with one embodiment of the instant disclosure.

Subsequently, please refer to FIG. 1 and FIG. 2M. In step S108, a plurality of contacting pads is formed on the first electrode, the second electrode, and the conductive structure. Specifically, as shown in FIG. 2M, the contacting pads 7a-7c are respectively formed in the aperture regions 18a-18c of the dielectric layer 18 to respectively contact the first pad 21, the second pad 22 and the pad 20b, so that the first semiconductor device 1 can be electrically connected to an external circuit. The contacting pads 7a-7c can be formed by a solder ball process, a pillar bump process, a solder bump process, an electroplating process, or a screen printing solder paste process.

Please refer to FIG. 1, and proceed to step S109. In step S109, a cutting process is performed along the cutting portion to form a plurality of separated semiconductor device package structures. In one embodiment, the cutting process is carried out by a cutting machine Because the conductive structure 20a' is not formed on the cutting portion 101a of the outer region 101, the cutting tool of the cutting machine is used to cut the semiconductor material and a thinner back electrode layer instead of a thicker metal material layer. Accordingly, the attrition rate of the cutting tool can be reduced. In another embodiment, the cutting process can be carried out by a laser.

As shown in FIG. 3A, after the cutting process, a plurality of separated semiconductor device package structures M1 are formed, in which the drain at the back side of the semiconductor device package structure M1 can be electrically connected to the contacting pad 7c at the active surface 10 through the back electrode layer 19 and the conductive structure 20'. When the semiconductor device package structure M1 is mounted on a printed circuit board (PCB) (not shown), the active surface 10 faces to the PCB. Accordingly, the drain at the back side of the semiconductor device package structure M1 can be electrically connected to the PCB through the contacting pad 7c, in which the PCB is located at a front side of the semiconductor device package structure M1. As previously mentioned, in another embodiment, the step of attaching the metal plate 8 to the back electrode layer 19 is omitted, and a plurality of separated semiconductor device package structures M2 without the metal plate 8 are formed after the cutting process, as shown in FIG. 3B. Because the semiconductor device package structure M2 does not include the metal plate 8, another means can be provided to assist the heat dissipation and enhance the mechanical strength of the semiconductor device package structure M2.

Figure 4:
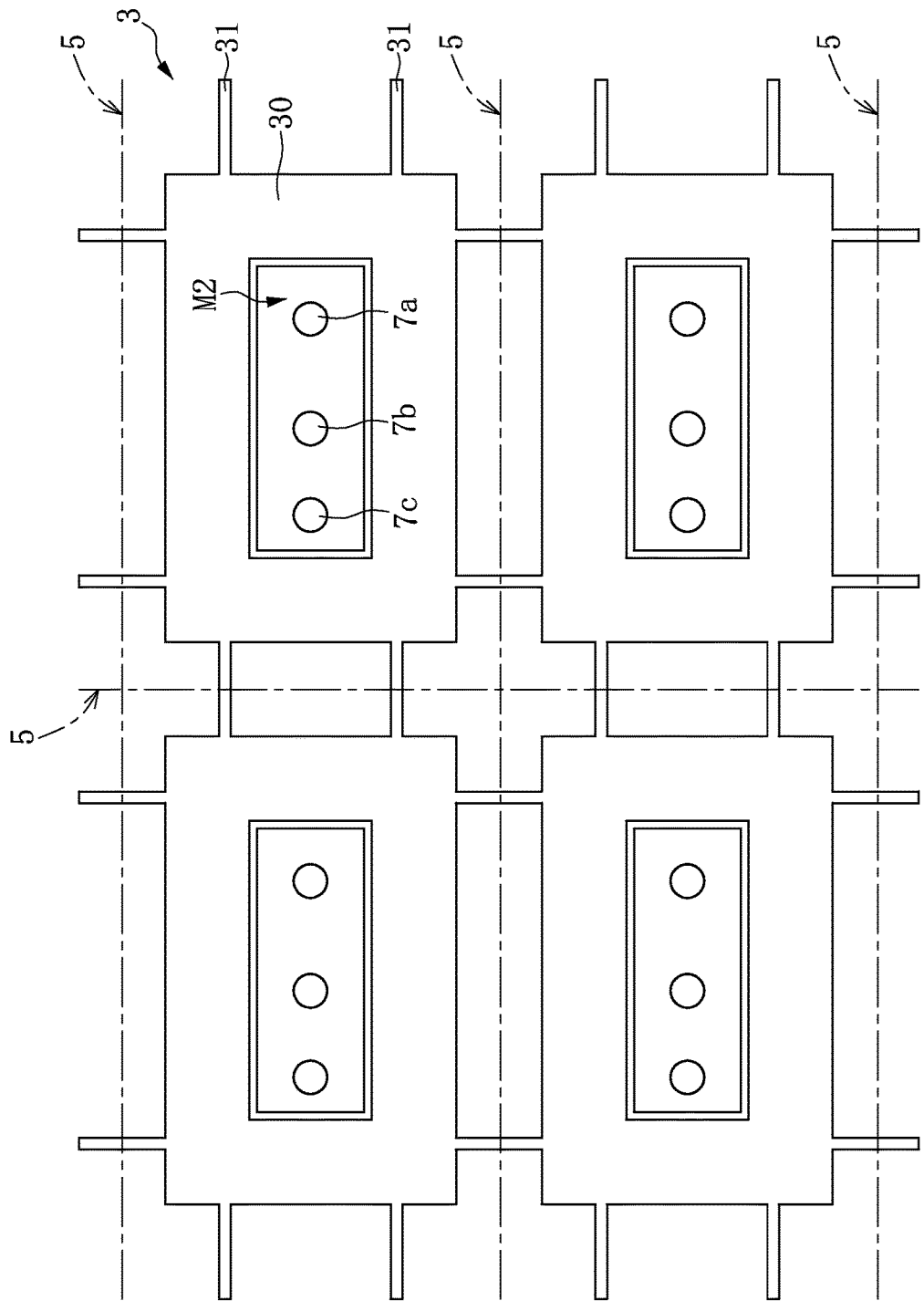
FIG. 4 shows a top view of the semiconductor device package structure placed on a lead frame.

Please refer to FIG. 4, which illustrates a top view of the semiconductor device package structure placed on a lead frame, in which the semiconductor device package structure can be the semiconductor device package structure M2 shown in FIG. 3B. Additionally, the manufacturing method of the ultra-thin semiconductor device package structure can further include the following steps:

First, a lead frame 3 is provided. Specifically, the lead frame 3 includes a plurality of die pads 30, each of which has a surface to be in contact with the semiconductor device package structure M2, as shown in FIG. 4.

Subsequently, after the cutting process the individual semiconductor device package structures M2 are fixed on the die pads 30 by a thermal-conductive adhesive, and each of the semiconductor device package structures M2 and each of the die pads 30 are assigned in a one-to-one manner with respect to each other. Specifically, before the semiconductor device package structures M2 are placed on the die pads 30, the surface of each of die pads 30 is printed with the thermal-conductive adhesive (not shown). The thermal-conductive adhesive is, for example, an electrical-conductive adhesive, an insulation thermal conductive adhesive or a tin paste. Subsequently, each of the semiconductor device package structures M2 can be picked up and respectively placed on the corresponding die pads 30 by a pick and place apparatus.

Thereafter, a thermal process is performed to cure the thermal conductive adhesive so that each of the semiconductor device package structures M2 is fixed on the corresponding die pad 30. The thermal process can be performed by transferring the lead frame 3 into an oven and raising the temperature of the lead frame 3. Subsequently, the lead frame 3 is cut so that the plurality of die pads 30 is separated from the lead frame 3.

In the instant embodiment shown in FIG. 4, the lead frame 3 has a plurality of bars 31 for holding each of the die pads 30. When the lead frame 3 is cut, the cutting tool can be used to cut the bars 31 along the cutting lines 5 shown in FIG. 4 so that the die pads 30 are separated from each other and the final products are completed.

Notably, the semiconductor device package structure M2 has thinner thickness than that of the semiconductor device package structure M2 after the cutting process, and the die pad 30 can protect the semiconductor device package structure M2 from being broken during transportation. Additionally, the heat generated by the semiconductor device package structure M2 can be easily dissipated through the die pad 30.

[The Effectiveness of the Embodiments]

In summary, manufacturing methods of an ultra-thin semiconductor device package structure are provided in the abovementioned embodiments. In the manufacturing method, before the thinning process is performed, some steps of fabricating the redistribution layer are completed. In addition, during the thinning process, the wafer is fixed on the supporting board, which can attenuate the occurrence of wafer warpage. As such, the probability of breaks or cracks on the wafer during following processes or transportation can be decreased.

Furthermore, the supporting board is separated from the wafer after the fabrication of the back electrode layer is completed. Accordingly, even if the supporting board is separated from the wafer, the back electrode layer also can support the wafer and enhance the mechanical strength of the wafer to reduce the breakage rate of the wafer.

In addition, during the manufacturing method of the ultra-thin semiconductor device package structures in the embodiments of the instant disclosure, the semiconductor device can be either attached by metal plate before the cutting process, or be fixed on the die pad through thermal-conductive adhesive. Accordingly, the die pad or the metal plate can strengthen the mechanical strength of the semiconductor device package structure. Furthermore, the heat generated due to the operation of the semiconductor device package structure can be dissipated through either the thermal conductive adhesive and the die pad, or the conductive adhesive and metal plate, which can avoid the performance of the semiconductor device from being impacted due to high temperature. The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A manufacturing method of an ultra-thin semiconductor device package comprising:
   providing a wafer having a plurality of semiconductor devices, wherein a first semiconductor device of the semiconductor devices has an active surface and a back surface, the active surface has an active region and an outer region, a first electrode and a second electrode are arranged in the active region, and the outer region is divided into a cutting portion and a channel portion, wherein the first semiconductor device is a vertical power device;
   forming an patterned protecting layer on the active surface, wherein the patterned protecting layer has a plurality of openings to respectively expose the first electrode, the second electrode, and the outer region;
   forming a trench in the channel portion, wherein the trench has a first depth less than a thickness of the wafer, and the cutting portion has no trench formed therein;
   after the step of forming the trench in the channel portion, forming a metal barrier layer conformingly covering inner walls of the trench, the patterned protecting layer, the first electrode, and the second electrode;
   forming a photoresist layer on the metal barrier layer, wherein the photoresist layer has a plurality of opening patterns respectively corresponding to the first electrode, the second electrode, and the channel portion:
   forming a metal conductive structure in the trench and a plurality of metal conductive layers respectively in the opening patterns; and
   removing the photoresist layer and a portion of the metal barrier layer covered by the photoresist layer to form a first pad, a second pad, and forming a conductive structure, the conductive structure being formed in the trench located at the channel portion;
   disposing the wafer on a supporting board with the active surface facing to the supporting board;
   performing a thinning process from the back surface to expose the conductive structure formed inside the trench;
   forming a back electrode layer on an entire back surface of the wafer, wherein the back electrode layer is directly connected to the conductive structure so that a drain of the first semiconductor device is electrically connected to the conductive structure;
   separating the supporting board from the wafer;
   forming a plurality of contacting pads on the active surface to respectively electrically connect the first electrode, the second electrodes and the conductive structure; and
   performing a cutting process on the cutting portion to separate the wafer.

2. The manufacturing method of an ultra-thin semiconductor device package according to claim 1, wherein after the step of performing the thinning process, the trench has a second depth less than the first depth.

3. The manufacturing method of an ultra-thin semiconductor device package according to claim 1, wherein the first electrode serves as a gate electrode, the second electrode serves as a source electrode, and the back electrode layer serves as a drain electrode.

4. The manufacturing method of an ultra-thin semiconductor device package according to claim 1, wherein the supporting board includes a plate body and an adhesive layer, when the wafer is disposed on the supporting board, the adhesive layer is connected between the active surface and the plate body.

5. The manufacturing method of an ultra-thin semiconductor device package according to claim 1, wherein the conductive structure includes a pad formed on the active surface and a connecting portion formed inside the trench.

6. The manufacturing method of an ultra-thin semiconductor device package according to claim 1, wherein after the step of forming the first pad, the second pad, and the conductive structure, and before the step of disposing the wafer on the supporting board, the manufacturing method further comprises:
forming a dielectric layer on the active surface, wherein the dielectric layer has a plurality of aperture regions to respectively expose a portion of the first pad, a portion of the second pad, a portion of the pad, and the cutting portion.

7. The manufacturing method of an ultra-thin semiconductor device package according to claim 6, wherein the step of forming the dielectric layer on the active surface, the manufacturing method further comprises: respectively forming the contacting pads on the first pad, the second pad, and the pad through the corresponding aperture regions.

8. The manufacturing method of an ultra-thin semiconductor device package according to claim 1, wherein the metal barrier layer is made of a material selected from the group consisting of titanium, copper, tungsten and the combination thereof.

9. The manufacturing method of an ultra-thin semiconductor device package according to claim 1, wherein after the step of separating the supporting board from the wafer and before the step of performing the cutting process, the manufacturing method further comprises: attaching a metal plate to the back electrode layer with a conducting adhesive.

10. The manufacturing method of an ultra-thin semiconductor device package according to claim 1, wherein after the step of performing the cutting process, a plurality of semiconductor device package structures separated from each other are formed, and the manufacturing method further comprises:
providing a lead frame having a plurality of die pads; and
respectively fixing the separated semiconductor device package structures on the die pads by a thermal conductive adhesive; and
cutting the lead frame to separate the die pads from the lead frame.

11. The manufacturing method of an ultra-thin semiconductor device package according to claim 1, wherein the thinning process is performed until the wafer is thinned to have a predetermined thickness, in which the predetermined thickness ranges from 50 µm to 60 µm.

* * * * *